United States Patent [19]

Higgins

[11] Patent Number: 5,029,445
[45] Date of Patent: Jul. 9, 1991

[54] THERMAL ELECTRIC COOLING SYSTEM FOR LIQUIDS

[76] Inventor: Robert W. Higgins, 45 S. Pine Ct., San Jose, Calif. 95111

[21] Appl. No.: 495,831

[22] Filed: Mar. 19, 1990

[51] Int. Cl.$^5$ .............................................. F25B 21/02
[52] U.S. Cl. .......................................... 62/3.2; 62/3.6
[58] Field of Search ................................. 62/3.2, 3.6

[56] References Cited

U.S. PATENT DOCUMENTS

| | | | |
|---|---|---|---|
| 3,196,620 | 7/1965 | Elfving et al. | 62/3.2 |
| 3,197,342 | 7/1965 | Neild, Jr. | 62/3.2 X |
| 4,306,426 | 12/1981 | Berthet et al. | 62/3.2 |

Primary Examiner—Lloyd L. King
Attorney, Agent, or Firm—Flehr, Hohbach, Test, Albritton & Herbert

[57] ABSTRACT

Thermal electric cooling system for a liquid bath having a thermal electric device with a liquid inlet and a liquid outlet. A motor driven pump having an inlet and an outlet is provided which has the outlet of the pump connected to the inlet of thermal electric device. A heat exchanger having an inlet and an outlet is provided which has the inlet connected to the outlet of the thermal electric device. Piping is provided which is adapted to connect the outlet of the heat exchanger to the liquid bath and the liquid bath to the inlet of the pump. Heating means is provided for supplying heat to the heat exchanger.

8 Claims, 3 Drawing Sheets

THERMAL ELECTRIC COOLING SYSTEM FOR LIQUIDS

This invention is for a thermal electric cooling system for liquids and more particularly to a solid state system for wet process stations utilized in the semi-conductor industry.

In the past Freon recirculating systems have been utilized in connection with process stations in the semi-conductor industry. Such a system typically has a number of mechanical parts including a Freon pump which can fail. In addition, such systems have a tendency to develop leaks which release Freon to the atmosphere which may cause environmental problems. An additional disadvantage of such Freon systems is that they have been rather bulky and it has been difficult to fit them beneath wet processing stations. Also, they are quite heavy precluding placement on top of the processing stations. In addition, such similar systems have had very limited safety features. There is therefore a need for a new and improved cooling system for liquids which overcomes these disadvantages.

In general, it is an object of the present invention to provide thermal electric cooling system for liquids which does not require the use of Freon.

Another object of the invention is to provide a system of the above character which is solid state.

Another object of the invention is to provide a system of the above character which is relatively lightweight and compact.

Another object of the invention is to provide a system which can readily fit below a wet process station.

Another object of the invention is to provide a system of the above character which has numerous safety features to prevent destruction of the cooling system.

Additional objects and features of the invention will appear from the following description in which the preferred embodiments are set forth in detail in conjunction with the accompanying drawings.

Figure 1:
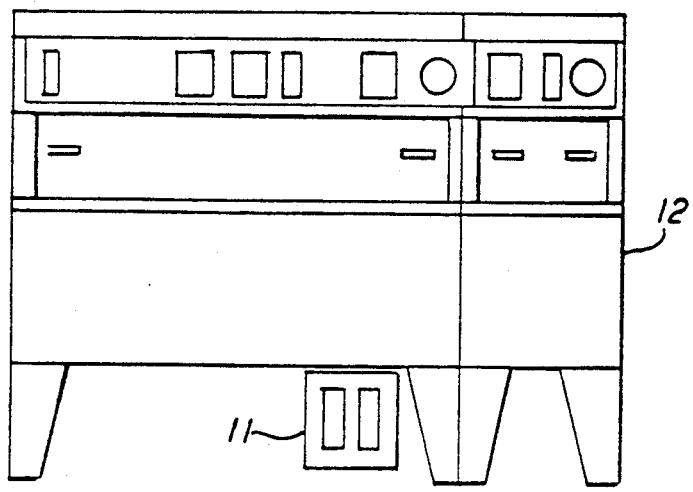
FIG. 1 is a front elevational view of a thermal electric cooling system incorporating the present invention which is utilized for cooling liquid in a wet process station.
Figure 2:
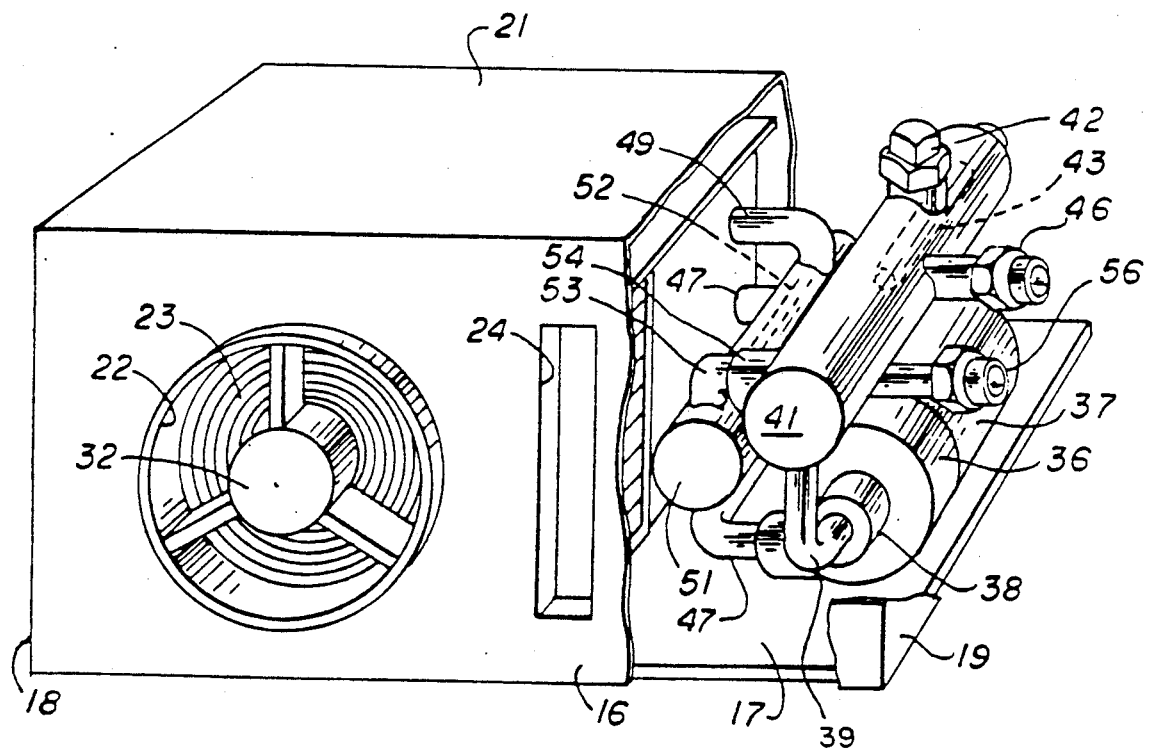
FIG. 2 is an isometric view of the thermal electric cooling system shown in FIG. 1 with a major portion of the cover broken away.

In general, the thermal electric cooling system for liquids of the present invention consists of a thermal electric device having a liquid inlet and outlet. A motor driven pump is provided having an inlet and an outlet. Means is provided for connecting the outlet of the pump to the inlet of thermal electric device. A heat exchanger is provided having an inlet and an outlet. Means is provided for connecting the outlet of the thermal electric device to the inlet of the heat exchanger. Piping means is provided which is adapted to connect the outlet of the heat exchanger to the liquid bath and the liquid bath to the inlet of the pump. Means is provided for supplying heat to the heat exchanger.

More specifically, the thermal electric cooling system 11 is mounted below a conventional wet process station 12 utilized in the semiconductor industry for processing semiconductor wafers. As hereinafter described, the thermal electric cooling system 11 is utilized for maintaining a predetermined liquid temperature in a liquid bath in the wet process station 12. The system 11 is provided with a case or housing 16 which has a base 17 formed of a suitable material such as plastic. First and second parallel end panels 19 are secured to the base 17 by suitable means such as screws (not shown). A U-shaped member 21 fits over the end panels 18 and 19 and is also secured to the base 17 by suitable means such as screws (not shown). The U-shaped member 21 is provided with large openings 22 on opposite sides of the same which are covered by grills 23. It is also provided with elongate vertical slots 24 on opposite sides as well as circular openings 26 on opposite sides to permit access to ambient air.

A conventional thermal electric device assembly 31 is mounted upon the base 17. It utilizes thermal electric devices of the type manufactured by Thermal Electric Cooling American Corporation located at 448 North Halsted Street, Chicago, Ill. 60622, hereinafter referred to as TECA. The devices or modules which are utilized in the assembly are also of a conventional type manufactured by Marlow Industries, Inc. at 10451 Vista Park Road, Dallas, Tex. 75232. By way of example, six modules have been incorporated into the thermal electric device assembly 31. The assembly 31 is cooled by a pair of muffin fans 32 disposed on opposite sides of the device assembly 31 which pull which direct heated air away from the thermal electric device assembly 31 and discharge the heated air through the openings 22 and the slots 24 in the case 16.

The system 11 also includes a pump 36 driven by an in-line motor 37 both of which are mounted upon the base 16. The pump 36 is provided with an inlet fitting 38 which is connected by a pipe 39 to a cylindrical reservoir 41. The reservoir 41 is provided with a removable fill cap 42. It is also provided with a liquid level sensor 43 mounted within one end of the reservoir 41. The level sensor 43 is of a conventional type and for example, can be No. 6905-100 of a series 15-650 float switch manufactured by Compac Engineering, Inc. of Paradise, Calif. 95969. The liquid level sensor 43 is placed at the highest point of the system and it is for that reason, placed in the reservoir 41 because it is at the highest elevation.

The reservoir 41 is provided with an inlet 46 which serves as a return for liquid as hereinafter described. The pump 36 supplies its output through an outlet 47 which is connected to the inlet of the solid state cooler in the form of the thermal electric device assembly 31. The liquid then passes through the thermal electric device assembly 31 and is cooled thereby and then passes through an outlet pipe 49 to a cylindrical heat exchanger 51. The heat exchanger 51 is provided with a heater 52 of a conventional type such as an electric Cal rod heater of a suitable size as, for example, 850 watts. The liquid, after it passes through the heat exchanger 51, passes through an outlet 53 and through a flow switch 54. The flow switch can be of a suitable type also manufactured by Compac such as 0.1 gallons per minute, No. 6957, 521-P, The output from the flow switch 54 is supplied by a pipe 56 to the bath of the wet process station.

Figure 3:
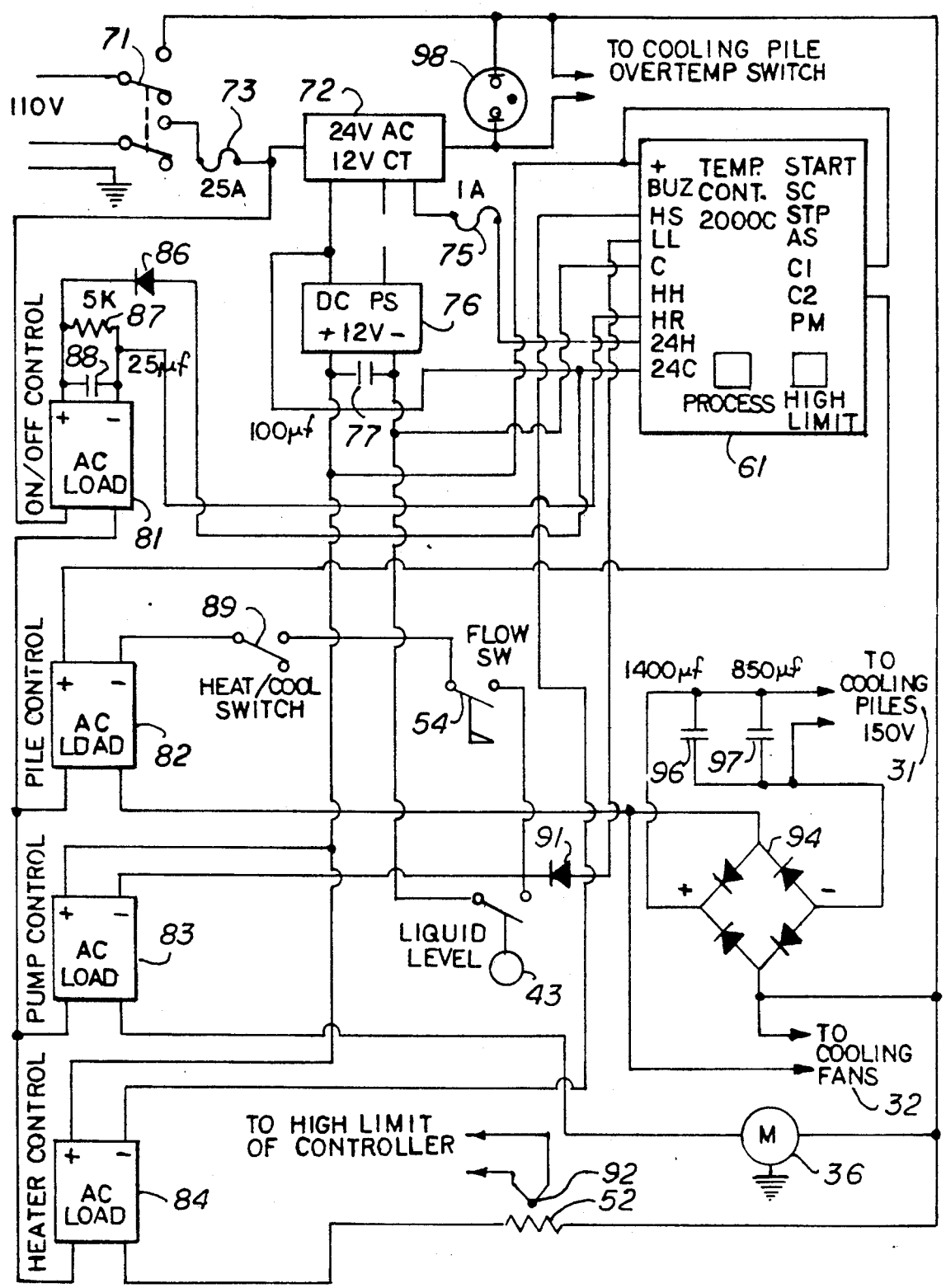
FIG. 3 is a wiring diagram for the thermal electric cooling system shown in FIG. 2.
Figure 4:
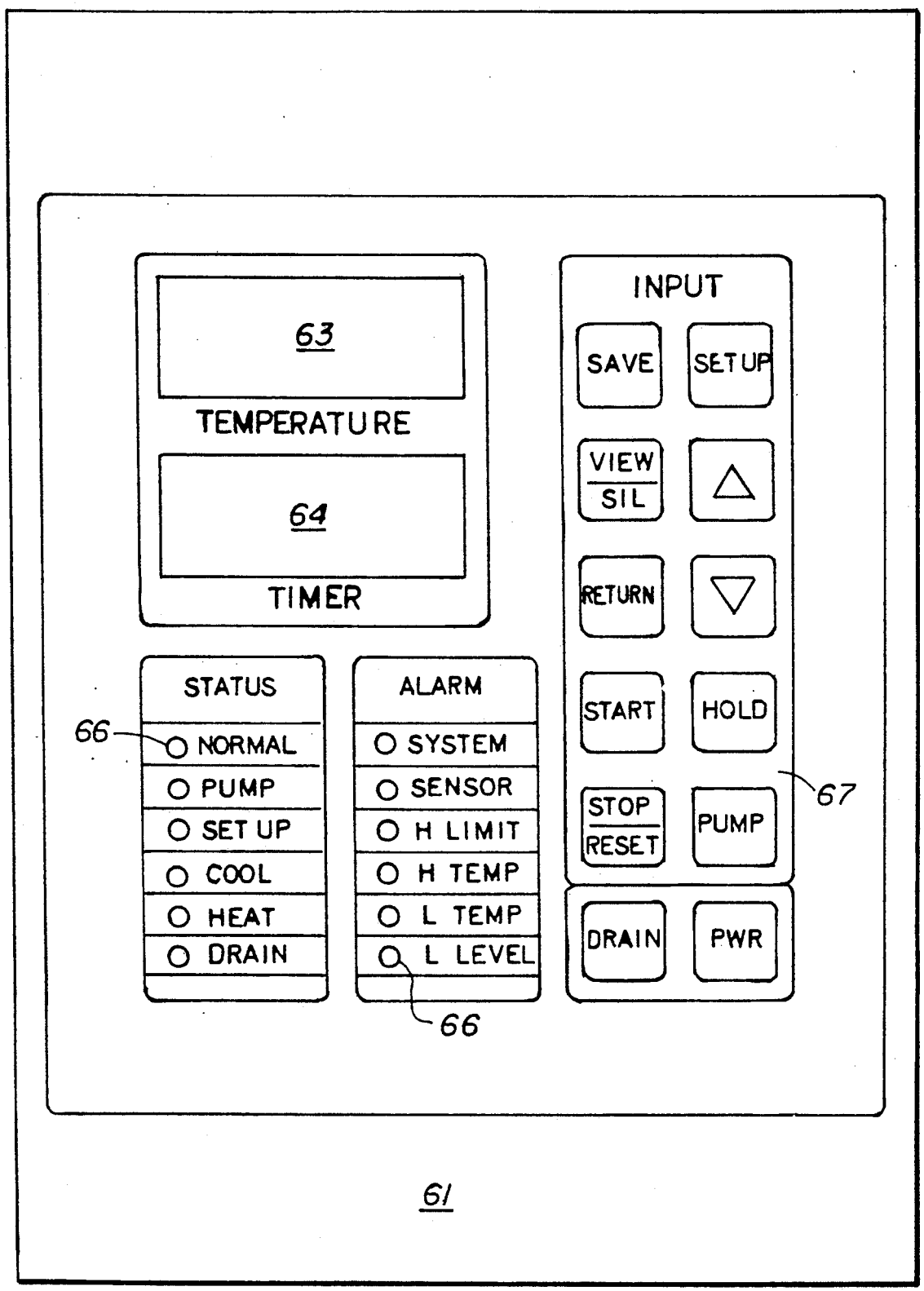
FIG. 4 is a view showing the front panel of a controller used int he system in FIG. 1.

The thermal electric cooling system 11 also includes wiring which is shown in FIG. 3. As shown in the wiring diagram in FIG. 3, the system 11 includes a controller 61. The controller 61 can be mounted in a convenient location in the wet process station. The controller 61 is provided with a front panel 62 of the type shown in FIG. 4. The controller 61 is a controller/timer and is microprocessor based. As can be seen from the front panel, the controller 61 is provided with two numeric displays 63 and 64, one displaying temperature in degrees C. and the other displaying time in minutes and seconds. Twelve discrete light emitting diodes (LED's) are provided to indicate status and alarm conditions as shown in FIG. 4. A 12-key membrane switch 67 is also provided for inputting various functions of the controller. Each of the displays 63 and 64 has multiple diagnostic and setup functions that are activated by the keyboard or by the microprocessor during various setup and alarm conditions as hereinafter described.

As shown in FIG. 3, the circuitry therein is supplied with power from a suitable source, such as 110 volts AC through an on/off switch 71 which supplies power to a transformer 72 through a 25 ampere fuse 73. The transformer 72 provides a 24 volt AC and 12 volts AC at a center tap. The 24 volts AC is supplied to the controller 61 through a 1 ampere fuse 75. The 12 volts AC is supplied to a DC power supply 76 which provides 12 volts DC filtered by a capacitor 77. Solid state relays (SSR) 81, 82, 83 and 84 are provided for controlling the application of AC power to the various components of the system. DC power is supplied to the SSR 81 from the AC of the controller 61 through the diode 86, resistor 87 and capacitor 88. SSR 81 supplies power for the on/off control, SSR 82 for the cooling pile control, SSR 83 for the pump control and SSR 84 for the heater control. The SSR's 82, 83 and 84 are supplied with DC from the controller 61. The power control SSR 82 is also controlled by the heat/cool switch 89 and also by the flow switch 54. Similarly, the pump control SSR 83 is under the control of the liquid level switch 43 through power supplied a diode 91. The temperature of the heater 52 is sensed by a thermistor 92 which is connected to the controller 61. When an over temperature condition is sensed the temperature controller shuts the system down and the high limit light on the controller is lit. Power is supplied to the cooling piles 31 under the control of the SSR 81 through a diode bridge 94 and a filter comprised of capacitors 96 and 97 to provide an output voltage of approximately 150 volts DC to the cooling piles. A neon indicator 98 of a conventional type is provided and is connected to an over temperature switch (not shown) in the cooling pile for sensing an over temperature in the cooling piles. When an over temperature condition is sensed in the cooling piles, the system is shut down and the neon indicator 98 is lit.

To place the thermal electric cooling system 11 of the present invention in operation, the fill cap 42 is removed and approximately 500 milliliters of water or antifreeze are placed in the reservoir 41. Alternatively, if desired, a mixture of antifreeze and water can be utilized, as for example, a mixture of 20% antifreeze and the remainder distilled water. The antifreeze is unnecessary because freezing temperatures will not be encountered. However, the antifreeze serves as a system lubricant.

Operation of the thermal electric cooling system 11 can now be described in conjunction with the controller 61. The "PWR" is pressed in the membrane switch 67 to turn on the system. At this time the word "HOLDS" will appear in the temperature display 63 which indicates that the controller 61 is in the standby mode. The "RETURN" key is then depressed which turns on the thermal electric cooling unit 31. The "PUMP" key is then depressed to start the operation of the cascade pump (not shown) associated with the filter etch bath which starts cycling the acid in the filter etch bath in the wet process station 12. The red LED for the pump would be lit. As shown in FIG. 4, there are six status LEDs and six alarm LEDs. The alarm LEDs are essentially visual annunciators of system malfunctions.

As soon as liquid fills the reservoir 41 the liquid level sensor 43 turns on the recirculating pump 36 to fill the thermal electric device assembly and the piping and cooling coils in the filter etch bath. Once there is established enough pressure in this closed loop system to turn on flow switch 54, one side of the voltage control to the pile control is supplied by the controller 61. Once there is power to the pile control SSR 82 the cooling pile will start cooling the liquid passing through it from the recirculating pump 36, and through heat exchanger 51 where it is heated if necessary and then exits into the cooling coils of the filter etch bath 11.

The system 11 has the capability of setting various parameters through the use of the controller 61 by depression of the "SET-UP" key, the controller will step through various parameters which will be displayed. They are as follows:

| CODE | DESCRIPTION |
| --- | --- |
| CS | Clock Setpoint |
| PA | Pre-Alarm Offset |
| PS | Process Setpoint |
| HI | High Alarm Setpoint |
| LO | Low Alarm Setpoint |
| DR | Drain Setpoint |
| DP | Drain Period |
| CL | Cooling Setpoint |
| AC | Access Code |
| CR | Cycle Rate |
| Pb | Proportional Band |
| rE | Reset |
| rA | Rate |
| CA | Calibration |
| CD | Clock Direction |

While in this mode, depressing either the "UP" or "DOWN" key will cause the display to advance or retard. Depressing the key once and releasing will allow the accurate setting of the least significant digit. Holding either key down will activate the automatic, rapid incrementing or decrementing of the display. To exit this mode the "RESET" key is depressed.

It has been found that with the system of the present invention that the temperature stability of a bath can be maintained within plus or minus a half of a tenth of a degree.

The process display provided by the controller 61 shows the sensor temperature at all times during subnormal operation except when the "VIEW" key is depressed at which time it displays the process setpoint.

The timer display 64 shows a current account of the timer at all times during normal operation.

The up/down count timer is presettable and will count down from the preset time or count up to the preset time depending on the mode selected. The "START" key is used to start the timer. The "STOP/RESET" key is used to stop the timer. Depression of the "DRAIN" key initiates the drain function to provide a timed, temperature interlock drain cycle. The "DRAIN" key may be used to start the drain cycle and also to stop it. If the cycle is not mechanically stopped before the timer elapses, the timer will automatically stop the drain.

Depression of the "return" key will turn on the cooling output SSR82 and cooling fans 32. This is also based on the program of the cooling (CL) and the process sendpoint (PS) parameter in the setup stack. Whenever the process setpoint is below the cooling setpoint, the cooling output will be on.

From the foregoing, it can be seen that a thermal electric cooling system has been provided which is particularly suitable for cooling liquids in wet process stations. The cooling system is solid state and eliminates the use of Freon. It is lightweight and compact so that it can readily fit below a wet process station. It is provided with numerous safety features to prevent destruction of the cooling system.

What is claimed is:

1. In a thermal electric cooling system for a liquid bath, a thermal electric device having a liquid inlet and a liquid outlet, a motor driven pump having an inlet and an outlet, means connecting the outlet of the pump to the inlet of thermal electric device, a heat exchanger having an inlet and an outlet, means connecting the outlet of the thermal electric device to the inlet of the heat exchanger, piping means adapted to connect the outlet of the heat exchanger to the liquid bath and the liquid bath to the inlet of the pump and heating means for supplying heat to the heat exchanger.

2. A system as in claim 1 wherein said heating means for the heat exchanger is comprised of an electrical heater disposed within the heat exchanger and in contact with liquid in the heat exchanger and electrical control means connected to the heating means and sensing the temperature of the liquid bath for automatically controlling the heater 3. A system as in claim 1 together with flow switch disposed in the piping connecting the outlet of the exchanger to the liquid bath.

4. A system as in claim 1 wherein said piping means includes a liquid reservoir disposed at a level above the heat exchanger and the pump and having inlet and outlet, means connecting the outlet of the reservoir to the inlet of the pump and means connecting the inlet of the reservoir to the liquid bath.

5. A system as in claim 4 wherein said reservoir is provided with a removable fill cap and a liquid level sensor disposed in the reservoir.

6. A system as in claim 1 together with muffin fans disposed on opposite sides of the thermal electric device for moving air over the thermal electric device.

7. A system as in claim 4 together with a base for mounting said thermal electric device, said motor driven pump, said heat exchanger and said reservoir and a case mounted on said base, said case having openings therein in registration with the muffin fans.

8. A system as in claim 1 together with a microprocessor for controlling the operation of said thermal electric device, said pump and said heater and being connected to said flow switch and to said liquid level sensor whereby the system is shut down when the flow switch or the liquid level switches are in open positions.

* * * * *